(12) United States Patent
Brown

(10) Patent No.: US 10,141,468 B2
(45) Date of Patent: Nov. 27, 2018

(54) METHOD AND APPARATUS FOR A THERMOPHOTOVOLTAIC CELL

(71) Applicant: Malcolm L. Brown, Aliso Viejo, CA (US)

(72) Inventor: Malcolm L. Brown, Aliso Viejo, CA (US)

(73) Assignee: Atrius Energy, Inc., Huntington Beach, CA (US)

( * ) Notice: Subject to any disclaimer, the term of this patent is extended or adjusted under 35 U.S.C. 154(b) by 0 days.

(21) Appl. No.: 15/480,342

(22) Filed: Apr. 5, 2017

(65) Prior Publication Data

US 2017/0288083 A1    Oct. 5, 2017

Related U.S. Application Data

(60) Provisional application No. 62/318,760, filed on Apr. 5, 2016, provisional application No. 62/403,668, filed on Oct. 3, 2016.

(51) Int. Cl.
| | |
|---|---|
| *H01L 31/072* | (2012.01) |
| *H01L 31/18* | (2006.01) |
| *H01L 31/0224* | (2006.01) |
| *H01L 31/0336* | (2006.01) |
| *H01L 31/0216* | (2014.01) |
| *H01L 31/032* | (2006.01) |
| *H02S 10/30* | (2014.01) |

(52) U.S. Cl.
CPC .... *H01L 31/072* (2013.01); *H01L 31/022425* (2013.01); *H01L 31/032* (2013.01); *H02S 10/30* (2014.12); *Y02E 10/50* (2013.01)

(58) Field of Classification Search
CPC .......... H01L 31/072; H01L 31/022425; H01L 31/032; H02S 10/30
USPC ...................................................... 136/253
See application file for complete search history.

(56) References Cited

U.S. PATENT DOCUMENTS

| | | | | |
|---|---|---|---|---|
| 6,043,426 A | * | 3/2000 | DePoy | H01L 31/02167 136/206 |
| 2012/0024359 A1 | * | 2/2012 | Hou | H02S 10/30 136/253 |
| 2018/0076341 A1 | * | 3/2018 | Faur | H01L 31/02168 |

\* cited by examiner

*Primary Examiner* — Jayne L Mershon
(74) *Attorney, Agent, or Firm* — Kafantaris Law Offices; Theo Kafantaris

(57) ABSTRACT

The present device is a thermophotovoltaic (TPV) cell adapted to charge the battery of an electronic device efficiently and cost-effectively. This is accomplished by specifically layering N-Type and P-type semiconductors in several layers while also introducing extrinsic doping agents that add to the conductivity of the oxides used for generating energy using ambient thermal energy. As such, electrical energy can effectively be drawn from a single heat reservoir.

15 Claims, 4 Drawing Sheets

METHOD AND APPARATUS FOR A THERMOPHOTOVOLTAIC CELL

CROSS REFERENCE TO RELATED APPLICATIONS

This application claims the benefit of U.S. Provisional Patent Application No. 62/318,760, filed on Apr. 5, 2016, and U.S. Provisional Patent Application No. 62/403,668, filed on Oct. 3, 2016, both of which are incorporated herein by reference.

STATEMENT REGARDING FEDERALLY SPONSORED RESEARCH AND DEVELOPMENT

Not Applicable.

FIELD OF THE INVENTION

The present invention is directed to a thermophotovoltaic cell, and more particularly, to a method and apparatus for a passive, thermophotovoltaic cell structure that can be used to create a high-power output in the form of electricity.

DISCUSSION OF RELATED ART

Thermophotovoltaics (TPVs) can generally be described as power generating systems for converting thermal energy into electrical energy. They typically comprise a thermal emitter and a photovoltaic power converter, and often further comprise concentrators, filters and reflectors. The basic principle is similar to that of traditional photovoltaics (PV), where a PN junction is used to absorb electromagnetic energy that lead to various types of recombination through the generation and separation of electron-hole pairs, and in doing so, converts the excited carrier's energy into electrical power following band gap theory.

The thermoelectric effect comprises three effects: The Seebeck Effect, the Peltier Effect, and the Thompson Effect. The Seebeck Effect can generally be described as the conversion of temperature differences directly into electricity. The Peltier Effect can generally be described as the presence of heating or cooling at an electrified junction (PN Junction) of two different conductors (N-Type and P-Type). When a current is made to flow through a junction that is between two differing conductors, heat may be generated (or removed) from said junction. The Thompson Effect predicts that temperature is not constant in the Seebeck Effect, and so a spatial gradient in temperature can result in a gradient in the Seebeck Coefficient. The Thomson Effect describes the heating or cooling of a current-carrying conductor with a temperature gradient.

The Band Gap Theory explains that semiconductors will act as insulators at absolute zero. Above this temperature, and yet still staying below the melting point of a solid, a metal will act as a semiconductor. Semiconductors are classified as either Intrinsic, P-Type, or N-Type. Intrinsic semiconductors have an equal amount of negatively charged electrons and positively charged electron holes. Electron holes are essentially the absence of an electron in an elements valence orbital that is capable of accepting an electron. A P-Type semiconductor has a deficiency of electrons in its valence band, hence the majority carrier in a P-Type is the positively charged electron hole. These electron holes lie in the valence band. An N-Type Semiconductor is typically trivalent, and thus has excess valence electrons that can be attracted to the positively charged holes when joined with the P-Type. The N-Type semiconductor's majority carriers are negatively charged carriers. Once joined, the fermi levels at the interfaces will even out (known as Ligand Exchange), and generally the junction will not produce any electrical energy, but will in fact maintain a minimum voltage barrier and will inhibit current flow until the correct voltage is applied.

The fermi level refers to the highest occupied molecular orbital at absolute zero. It is usually found at the center between the valence and conduction bands. The particles in this state each have their own quantum states and generally do not interact with each other. When the temperature begins to rise above absolute zero, these particles will begin to occupy states above the fermi level and states below the fermi level become unoccupied.

Electronegativity is a measure of the tendency of an atom to attract a bonding pair of electrons. The Pauling Scale is most commonly used for this measurement. Fluorine (the most electronegative element) is assigned a value of 4.0, and values range down to cesium and francium, which are the least electronegative at 0.7. Electronegativity tends to increase while moving right on the periodic table, as well as increase while moving up the periodic table.

Several thermoelectric devices exist in the prior art. The Peltier Device utilizes PN junctions that are thermally configured in parallel and electrically configured in series. The device utilizes the thermoelectric effect to generate electricity/heat or cool associate devices. The method of generating electricity by inducing a current through a spatial temperature gradient is inefficient and has largely been discarded as a practical means of powering/charging modern electronics.

The Monothermal Laminate Device (U.S. Pat. No. 6,103,054) utilizes a PN junction laminate, but emphasizes electronegativity as the standard behind its operation. The laminate's primary shortcoming is manifested in its unpractical energy generation to size ratio. In order for any useable amount of energy to be applied towards powering modern electronics, the surface area of the laminate must be exponentially larger in surface area and size than the present invention.

While current thermoelectric systems exist, they have many shortcomings that reduce efficiency and increase cost. Therefore, there is a continued need for a thermophotovoltaic cell adapted to charge the battery of a device efficiently and cost-effectively. The present invention satisfies these needs.

SUMMARY OF THE INVENTION

The present invention is a thermophotovoltaic (TPV) cell adapted to charge the battery of an electronic device efficiently and cost-effectively. This is accomplished by specifically layering N-Type and P-type semiconductors in four to five layers while also introducing extrinsic doping agents that add to the conductivity of the oxides used for generating energy using ambient thermal energy. As such, electrical energy can effectively be drawn from a single heat reservoir. At the atomic/molecular level, there will always be resonant frequency vibrations in the lattice of the semiconductors that can be used to create a disequilibrium and thus electrical energy generation. The present invention performs this function, but the ambient thermal energy quickly restores the lost energy in the form of heat.

The present invention overcomes the shortcomings of the Peltier Device by eliminating the requirement of a spatial temperature gradient, as the TPV Cells of the present invention do not require any temperature gradient to generate useable electricity. Operation of the TPV is contingent only on the ambient temperature of the environment. At 1 degree Fahrenheit, molecular motion can be expressed as ~255 kelvin. Furthermore, at 70 degrees Fahrenheit, the molecular motion can be measured at ~295 Kelvin. Even at temperatures that would logically be considered inadequate to justify the use of a thermophotovoltaic generator, the configuration of the present invention is able to operate at these temperatures. The TPV energy generation would in fact be derived from the ratio of watts per kelvin per centimeter squared. Therefore, if 1 milliwatt was generated per kelvin, at 70 degrees Fahrenheit (295 kelvin), the output generation of the TPV would be ~295 milliwatts.

The present invention overcomes the poor power generation of the Monothermal Laminate Device by the configuration methods of the layers as well as the composition of the substrates. By using Zinc Oxide, the hopping conductivity of charge carriers is enhanced due to the intrinsic defects of zinc oxide. It is a scientific fact that many elements and compounds have spin polarities that will read just the lattice until stoichiometry is achieved. Zinc oxide does not reform the lattice, thus an unexplained nonstoichiometric anomaly is consistently observed and has been recorded in various scientific publications. The present invention takes advantage of this "defect" and utilizes it to induce increased entropy into the thermodynamic microsystem while maintaining a macro-systematic equilibrium.

In an alternative embodiment, an oxidizing agent, such as potassium permanganate, enhances the effect of ambient energy absorption to increase the amount of trap defects as well as interstitials and oxygen vacancies. These are the primary means of conduction via charge carriers (electrons/holes).

The Monothermal Laminate Device also does not have a means of minimizing the parasitic effects of diffusion current. The present invention provides a means of capturing the diffusion current integrated into its design in the form of the mirrored P-N Junction with the common positive cathode. All of these improvements effectively enhance the output power of the present invention as well as overcome the obstacles faced by the Monothermal Laminate Device.

These and other objectives of the present invention will become obvious to those of ordinary skill in the art after reading the following detailed description of the preferred embodiments. It is to be understood that the foregoing general description and the following detailed description are exemplary, and are intended to provide further explanation of the invention as claimed.

DETAILED DESCRIPTION OF THE PREFERRED EMBODIMENT

Figure 1:
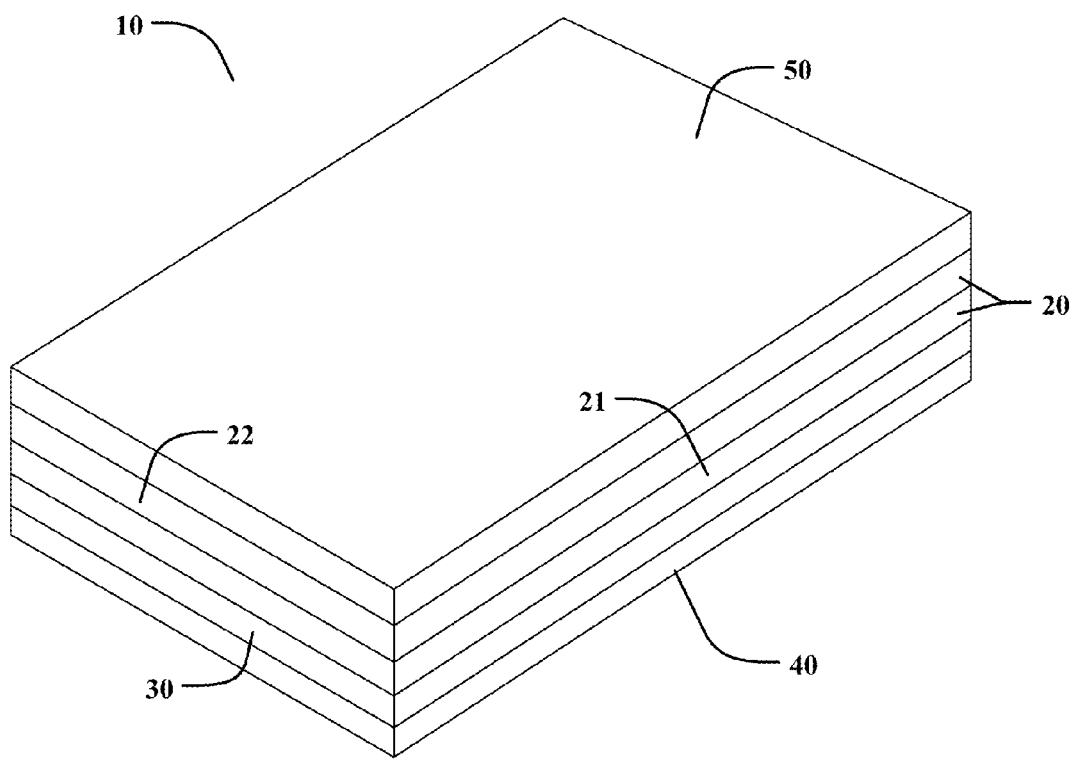
FIG. 1 is a diagram illustrating a five layer cell structure of the present invention.

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

Embodiments of the present invention are described herein in the context of a thermophotovoltaic cell 10 adapted to charge the battery of an electronic device efficiently and cost-effectively. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

The present invention discloses a thermophotovoltaic (TPV) cell 10 comprises a PN junction 20, passivation layer 30, and two conductive current collectors 40, 50 and is adapted to charge the battery of an electronic device efficiently and cost-effectively. This is accomplished by specifically layering N-Type and P-type semiconductors 21, 22 in a particular order, although forward bias, reverse bias, and heterostructures have all been observed to induce electrical generation. Heterojunction integration of the oxide layers seems to contribute the highest performance. As such, the energy in the form of all types of thermal energy transfer (heat) can be captured and converted to useable electrical power without the need for a temperature gradient and with minimal surface area exposure.

In the preferred embodiment, the present invention comprises of five layers for creating a voltage bias to create a direction for current to flow (see FIG. 1). This current is thermal kinetic energy that generally travels in unpredictable degrees of freedom, but with the voltage bias, and the metal oxides used, the random motion of the atoms can be directed in the same direction at the same time to excite charge carriers therefore creating electricity.

The first layer 40 is a conductive back surface field (BSF) or foil. The first layer 40 is adapted to serve as the positive terminal (cathode) and aid in current collection. In the preferred embodiment, the first layer 40 comprises Aluminum for its oxide-forming properties. The thickness of the cathode 40 ranges between 100-1000 micrometers.

The second layer is the passivation layer 30. The passivation layer 30 serves as a tunnel junction, allowing electrons to take on a wave form and effectively "tunnel" through the passivation layer 30. In the preferred embodiment, aluminum oxide is used for its resistance to corrosion, its ability to passivate the N-Type semiconductor/aluminum interface 21, and for its inherent insulation properties. In an alternative embodiment, the passivation layer 30 is omitted, which may improve functionality but also increase wear to the device and reduce longevity. The thickness of the passivation layer 40 ranges between 10-1000 nanometers The third layer is the N-Type metal oxide layer 21, and is the first part of the PN junction 20. In the preferred embodiment, the N-Type layer 21 comprises zinc oxide deposited through chemical vapor deposition. Zinc oxide has several properties that serve very important roles in the present invention. These properties include the exciton diameter length, which ranges between 20-100 mEv, as well as the 3d orbital to exhibit a desired behavior when conductivity type is measured. Furthermore, zinc oxide exhibits valence band anomalies, thus adding to the entropy of the PN junction 20 and the electrical generation, by proxy. The thickness of the N-Type layer 22 ranges between 10-1000 micrometers.

The fourth layer is the P-Type metal oxide layer 22, and is the second part of the PN junction 20. In the preferred embodiment, chromium III oxide is used for the P-Type layer 22 particularly because the conductivity type of chromium III oxide changes depending on the bias. In the preferred embodiment, the bias anomaly ranges between 2 and 10 mv. The thickness of the P-Type layer 22 ranges between 10-1000 micrometers.

The final layer is the negative terminal (anode) 50 for the thermophotovoltaic cell 10 that allows it to be introduced into an electrical circuit for the extraction of electricity. In the preferred embodiment, magnesium is used as the current collector due to amiable effects that magnesium has when used in conjunction with aluminum. Furthermore, since the electro-negativities of both metals differ only slightly, anodic oxidation is halted, and corrosion does not occur due to being electrically connected to a dissimilar metal. The thickness of the anode 40 ranges between 100-1000 micrometers.

The thickness of the PN junction 20 is contingent upon the application power requirements of the application for which it is used. More specifically, the power output of the thermophotovoltaic cell 10 is directly proportional to the thickness of the PN junction 20. In the preferred embodiment, the overall thickness of the thermophotovoltaic cell 10 ranges between 500-2500 micrometers.

In an alternative embodiment, two conductors of differing electronegativity are selected so as to provide a strong preference of current flow that the emitted electrons can follow. Here, the TPV cell comprises copper as the cathode 40 and aluminum magnesium alloy as the anode 50. Aluminum as well as magnesium can be utilized entirely by themselves. However, aluminum provides decreased power output and magnesium develops a non-conductive oxide layer which effectively contributes to parasitic behavior in the host cell due to poor contact at the metal/semiconductor interface. Therefore, an aluminum-magnesium alloy is desirable because it will not develop an oxide layer and the output power is at an acceptable level. After the conductive materials have been selected, the process of distributing the semiconductor substrates on the electrodes can be administered.

Figure 2:
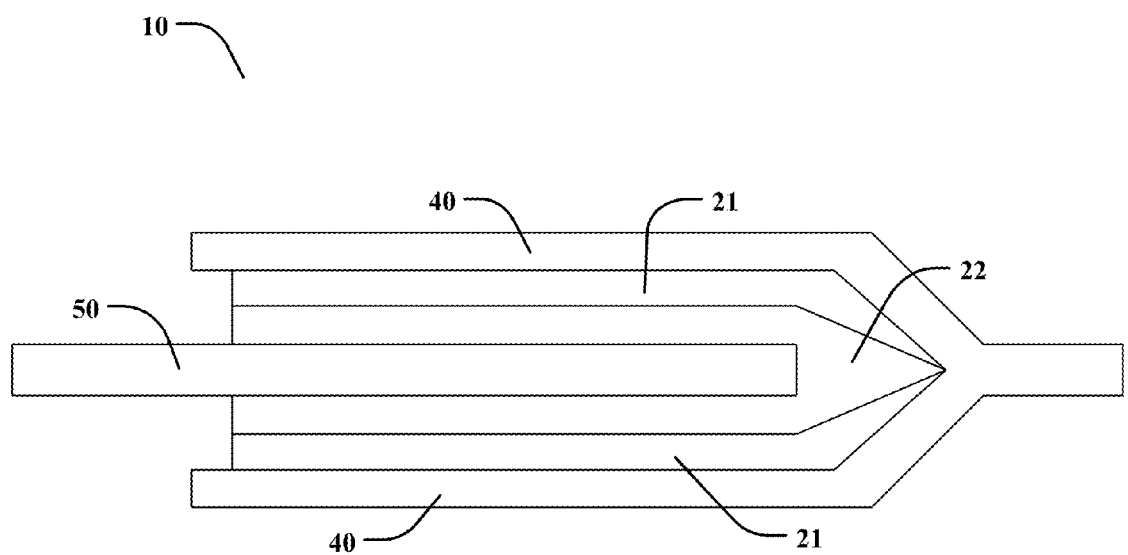
FIG. 2 is a diagram illustrating a single mirrored TPV cell structure of the present invention.

In a further alternative embodiment, the present invention provides a means of capturing the diffusion current integrated into its design in the form of the mirrored PN Junctions 20 with a common positive cathode 20 (see FIG. 2). All of these improvements effectively enhance the output power of the present invention as well as overcome the obstacles faced by other related devices. In yet a further alternative embodiment, an oxidizing agent, such as potassium permanganate, enhances the effect of ambient energy absorption to increase the amount of trap defects as well as interstitials and oxygen vacancies. These are the primary means of conduction via charge carriers such as electrons 23 and holes 29.

Figure 3:
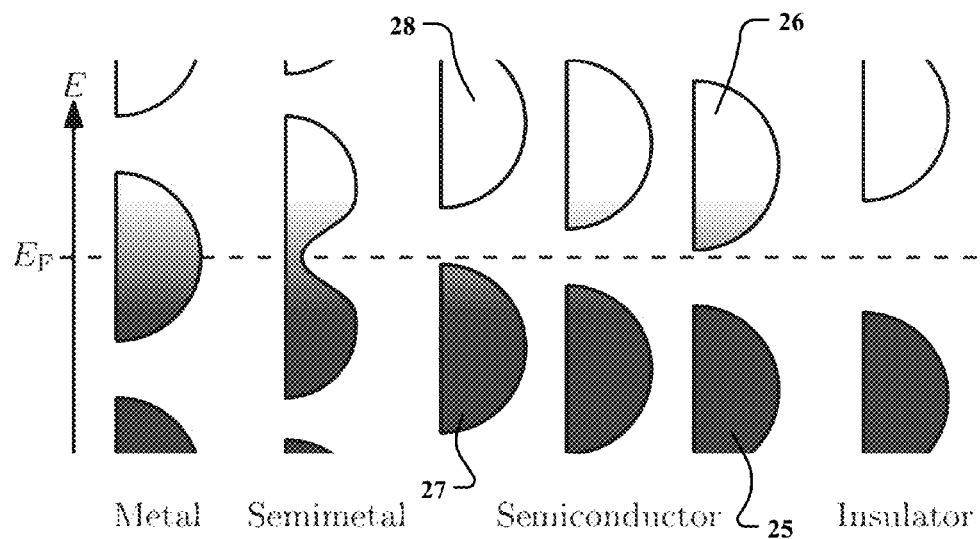
FIG. 3 is a diagram illustrating valence and conduction bands closest to the fermi level of a plurality of materials.
Figure 4:
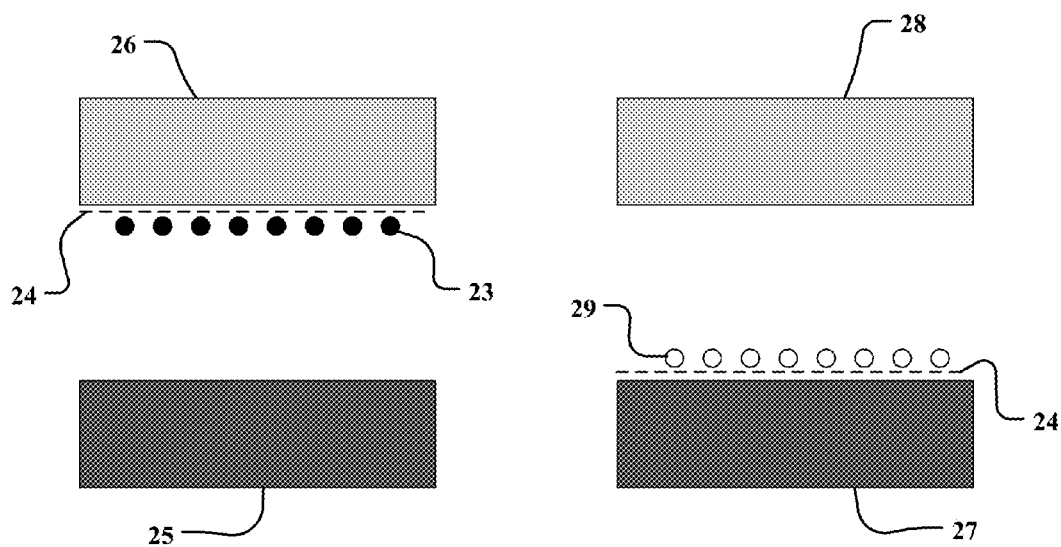
FIG. 4 is a diagram illustrating fermi levels of N-Type and P-Type junctions.
Figure 5:
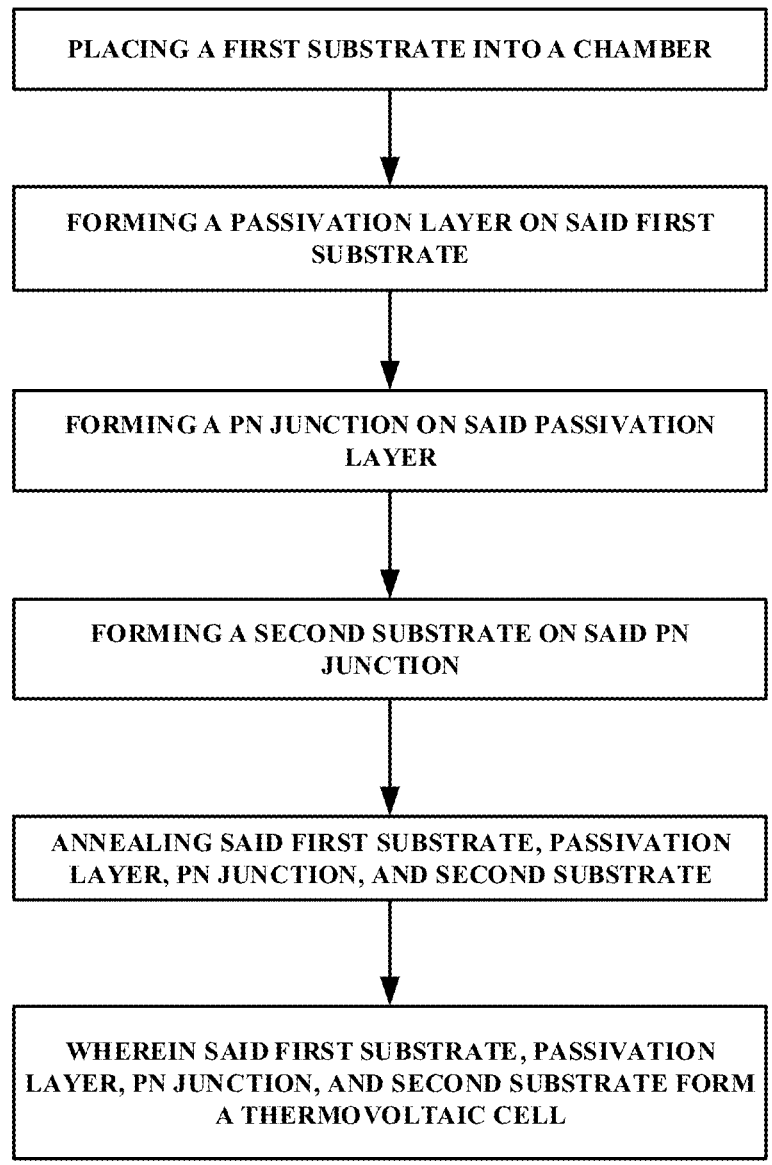
FIG. 5 is a diagram illustrating the method of manufacturing the present invention.

FIGS. 3 & 4 illustrate how the conduction band 26 of the N-Type semiconductor 25 and valence band 27 of the P-Type semiconductor 28 interact based on the amount of energy required to effectively excite a charge carrier from the valence band to the conduction band. This energy required is directly related to both materials fermi level 24, and difference thereof. The fermi level 24 of a body, defined as $E_F$, is a thermodynamic quantity and its significance is the thermodynamic work required to add one electron to the body, not counting the work required to remove the electron from wherever it came from. A precise understanding of the fermi level, specifically how it relates to electronic band structure in determining electronic properties and how it relates to the voltage and flow of charge in an electronic circuit, is essential to an understanding of solid-state physics. FIG. 4 specifically illustrates how the P-Types 27, 28 positively charged electron holes 29 and the N-Types 25, 26 negatively charged valence electrons 23 interact when enough energy is absorbed by the lattice to overcome the fermi level 24.

The present invention is manufactured such that the components work in conjunction to produce electricity from heat. The method of manufacturing the present invention comprises placing a first substrate 40 into a chamber, forming a passivation layer 30 on the first substrate 40, forming a PN junction 30 on the passivation layer 30, forming a second substrate 50 on the PN junction 20, and annealing the first substrate 40, passivation layer 30, PN junction 20, and second substrate 50 in a vacuum chamber with inert atmosphere such as argon. Once annealed, the first substrate 40, passivation layer 30, PN junction 20, and second substrate 50 form the thermophotovoltaic cell 10.

There are several methods which can be used to form the thermophotovoltaic cell 10. In the preferred embodiment, the passivation layer 30, PN junction 20, and second substrate 50 are formed on the first substrate 40 through chemical vapor deposition for thin-film, solid-crystalline layers. Here, the thermophotovoltaic cell 10 is annealed between 450-660 degrees kelvin for 6-10 hours. In an alternative embodiment, the passivation layer 30, PN junction 20, and second substrate 50 are formed on the first substrate 40 through spin coating for thin, amorphous layers. In a further alternative embodiment, liquid-phase epitaxy can be used to form the layers.

While a particular form of the invention has been illustrated and described, it will be apparent that various modifications can be made without departing from the spirit and scope of the invention. For example, while certain materials have been presented, any suitable materials can be used so long as they are functionally equivalent to those presented. Accordingly, it is not intended that the invention be limited, except as by the appended claims Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A thermophotovoltaic cell, comprising:
   a PN junction comprising a p-type semiconductor layer, wherein said p-type semiconductor layer further comprises chromium oxide;
   a passivation layer; and
   a pair of opposing conductive current collectors;
   wherein said PN junction and said passivation layer are positioned between said pair of opposing conductive current collectors.

2. The thermophotovoltaic cell of claim 1, wherein said PN junction further comprises an n-type semiconductor layer.

3. The thermophotovoltaic cell of claim 2, wherein said n-type semiconductor layer further comprises zinc oxide.

4. The thermophotovoltaic cell of claim 1, wherein said pair of opposing conductive current collectors further comprise an anode and a cathode.

5. The thermophotovoltaic cell of claim 4, wherein said anode further comprises magnesium, aluminum magnesium alloy, carbon, graphene, carbon nanotubes, gold, or silver adapted to operate as the negative terminal.

6. The thermophotovoltaic cell of claim 4, wherein said cathode further comprises aluminum, aluminum oxide, carbon, graphene, carbon nanotubes, gold, silver, or copper adapted to operate as the positive terminal.

7. The thermophotovoltaic cell of claim 1, wherein said passivation layer further comprises an insulation tunnel junction comprising aluminum oxide having a junction depth of 10 nm.

8. The thermophotovoltaic cell of claim 4, further comprising five layers, with the first layer being the cathode, the second layer being the passivation layer, the third and fourth layers being the PN junction, and the fifth layer being the anode.

9. A thermophotovoltaic cell, comprising:
   a PN junction comprising a p-type semiconductor layer, wherein said p-type semiconductor layer further comprises chromium oxide; and
   a pair of opposing conductive current collectors;
   wherein said PN junction is positioned between said pair of opposing conductive current collectors.

10. The thermophotovoltaic cell of claim 9, wherein said PN junction further comprises an n-type semiconductor layer.

11. The thermophotovoltaic cell of claim 10, wherein said n-type semiconductor layer further comprises zinc oxide.

12. The thermophotovoltaic cell of claim 9, wherein said pair of opposing conductive current collectors further comprise an anode and a cathode.

13. The thermophotovoltaic cell of claim 12, wherein said anode further comprises magnesium, aluminum magnesium alloy, carbon, graphene, carbon nanotubes, gold, or silver adapted to operate as the negative terminal and wherein said cathode further comprises aluminum, aluminum oxide, carbon, graphene, carbon nanotubes, gold, silver, or copper adapted to operate as the positive terminal.

14. The thermophotovoltaic cell of claim 9, further comprising a passivation layer, wherein said passivation layer further comprises an insulation tunnel junction comprising aluminum oxide.

15. The thermophotovoltaic cell of claim 12, further comprising four layers, with the first layer being the cathode, the second and third layers being the PN junction, and the fourth layer being the anode.

* * * * *